United States Patent [19]
Morikawa et al.

[11] Patent Number: 5,838,154
[45] Date of Patent: Nov. 17, 1998

[54] MULTILAYERED MAGNETIC SENSOR HAVING CONDUCTIVE LAYER WITHIN MEGNETIC LAYER

[75] Inventors: Takeshi Morikawa, Kasugai; Yuji Nishibe, Toki; Hideya Yamadera; Yutaka Nonomura, both of Nagoya; Masaharu Takeuchi, Owariasahi; Jiro Sakata, Nagoya, all of Japan

[73] Assignee: Kabushiki Kaisha Toyota Chuo Kenkyusho, Aichi-ken, Japan

[21] Appl. No.: 615,954

[22] Filed: Mar. 14, 1996

[30] Foreign Application Priority Data

Mar. 17, 1995 [JP] Japan ................................ 7-058839
Feb. 28, 1996 [JP] Japan ................................ 8-041766

[51] Int. Cl.$^6$ .................................................. G01R 33/02
[52] U.S. Cl. ............................................ 324/249; 324/260
[58] Field of Search ..................................... 324/244, 249, 324/250, 260, 207.13, 207.16; 360/110, 115; 235/449

[56] References Cited

U.S. PATENT DOCUMENTS 3,421,075  1/1969  Belson .................................... 324/249
4,635,152  1/1987  Iwasaki et al. ......................... 360/110
5,365,391  11/1994 Sugiyama et al. .................. 324/250 X

FOREIGN PATENT DOCUMENTS 472162   2/1992  European Pat. Off. ............... 324/249
6-283344 10/1994 Japan .
7-63832  3/1995  Japan .

OTHER PUBLICATIONS

Iwasaki et al; "Film Thickness . . . Using Induced RF Permeability Change," IEEE Transactions on Magnetics, vol. MAG–23, No. 5, Sep. 1987, pp. 2506–2508.

Senda et al; "High frequency measurement technique . . . magnetic film inductance line", Rev. Sci. Instrum., 64, No. 4, Apr. 1993, pp. 1034–1037.

*Primary Examiner*—Gerard R. Strecker
*Attorney, Agent, or Firm*—Oblon, Spivak, McClelland, Maier & Neustadt, P.C.

[57] ABSTRACT

A magnetic sensor element 1 includes a substrate 10, a conductive layer 12 of a conductive material, and a magnetic layer 11 of a magnetic material, which encloses the conductive layer 12. AC is applied to the element from a drive power source 50, and a detector 60 detects an impedance change due to an external magnetic field. The magnetic layer 11 is bestowed with magnetic anisotropy in a direction orthogonal to the direction of energization of the element 1. With the provision of the conductive layer 12 of conductive material and also with magnetic anisotropy imparted to the magnetic layer 1, the element 1 may be made a low resistivity element. A reactance change and a resistance change of the element due to an external magnetic field change, thus can be effectively detected in drive frequencies two orders of magnitude lower than in the case of a prior art magnetic sensor element. The magnetic anisotropy of the magnetic layer 11 is controlled to prevent magnetic field detection dynamic range variations with drive frequency.

21 Claims, 17 Drawing Sheets rot H = J = σE

OPERATION PRINCIPLES OF ELEMENT

SCHEMATIC ILLUSTRATION OF SKIN EFFECT

DOMAINS IN MAGNETIC FILM SURFACE

FREQUENCY REDUCING EFFECT OF LAMINATION 0.1mm OR ABOVE

EXTERNAL MAGNETIC FIELD (Oe)

IMPEDANCE VERSUS EXTERNAL MAGNETIC FIELD

IMPEDANCE CHANGE RATE VERSUS DRIVE FREQUENCY

MULTILAYERED MAGNETIC SENSOR HAVING CONDUCTIVE LAYER WITHIN MEGNETIC LAYER

BACKGROUND OF THE INVENTION

1. Field of the Invention

This invention relates to magnetic sensors for converting an external magnetic field intensity into an electrical signal, using a magnetic material inductance change as the basis for detection and, more particularly, to those magnetic sensors which have a magnetic multilayer for detecting low intensity magnetic fields at a high sensitivity.

2. Description of the Related Art

Magnetic field detection has been applied to various fields. For example, the number of rotations of a rotating shaft is detected as a magnetic field intensity change by a sensor having a magnetic material, which is mounted on the shaft, and the position of a moving object or the distance from the object is detected as a magnetic field intensity change. The magnetic field detection can be contact-free detection, so that it is particularly suited to the detection of moving objects, and it is also considered to be suited to position measurement concerning vehicles, machine tools and so forth.

To these ends, magnetic sensor elements using amorphous magnetic films (single layer films) are well known in the art. Such a sensor detects an external magnetic field intensity change as an inductance change. FIG. 1 shows such a magnetic sensor, which comprises an elongated element 900 comprising an amorphous magnetic film. A sinusoidal current at about 100 MHz is applied between the longitudinal ends of the element from a drive power source 950. By so doing, an AC magnetic field is set up in the element 900 in the width direction thereof.

With the AC magnetic field set up in the element 900 in the width direction thereof, the permeability $\mu$ of the amorphous magnetic film of the element 900 in the width direction of the film is changed according to a magnetic field externally applied to the element 900. This causes a change in the inductance L of the element 900, as shown in equation (1)

$$L = K\mu \quad (1)$$

where $\mu$ is the magnetic permeability of the layer, and k is a constant determined by the shape and the size of the layer.

According to the external field applied to the element 900, the impedance Z thereof between the two ends is changed as shown by equation (2).

$$Z = \sqrt{[R^2 + (\omega L)^2]} \quad (2)$$

where R is the resistance of the element, and $\omega$ is the angular frequency of the drive power source (drive frequency being shown as f). This relationship between the impedance Z and the external magnetic field intensity is as shown in FIG. 2. The external magnetic field (Hext) can thus be detected by detecting a voltage change corresponding to the impedance change using a sensor 951.

In the above way, the external magnetic field intensity can be detected with a simple structure utilizing an amorphous soft magnetic film.

The above prior art magnetic sensor detects a change in impedance Z corresponding to a change in permeability $\mu$. Therefore, it is necessary to provide a higher angular frequency in order to obtain a greater impedance change because the resistance R changes due to the skin effect. Experiments have proved that the drive frequency range should be at least 10 to 100 MHz in order to obtain sufficiently accurate magnetic field detection. This means that the magnetic sensor element causes generation of high frequency noise, which may have adverse effects on computer operation. Particularly, when the element is used for detecting the number of rotations of an automotive engine shaft, it may adversely affect a near-by engine control computer. This necessitates the computer having measures to cope with noise, or increases the price of a signal processing circuit in the sensor element.

When the element is driven at frequencies as high as several 10 MHz, it is necessary to take the capacitance and inductance constituting the floating impedance into consideration. This complicates the manufacture of the circuit.

The output characteristic of this type of element, as is obvious from FIG. 2, has a sensitivity sign inversion (negative to positive) point (or threshold point) that is encountered as the external magnetic field is increased from zero. In the usual case, the range up to the reaching of the threshold point is made to be a magnetic field detection range, i.e., a dynamic range, of the element. This range has been as narrow as 1 to 10 Oe. In addition, this dynamic range is subject to variation with the angular frequency $\omega$. Moreover, the output voltage of the element is small because of limitations imposed on the voltage that can be applied.

Narrow dynamic range permits magnetic field detection in a narrow range by the element used as a magnetic sensor. Therefore, it has been impossible to obtain magnetic field detection at an absolute value in a magnetic field intensity range of 1 to 20 Oe without influence of geomagnetism. Also, because of its small output, the element can not provide for a large distance between it and an object to be detected when it is utilized as a position sensor or a distance sensor which detects an absolute magnetic field. When its output is increased, the power consumption of the high frequency power source is also increased. A further problem in the prior art magnetic sensor is that predetermined magnetic field detection can not be obtained unless full use is made of the capacity of the element. Moreover, considerable restrictions are imposed on the magnetic field generation system including an amorphous magnetic film and an associated circuit.

SUMMARY OF THE INVENTION

The present invention is made in view of the foregoing problems inherent in the prior art magnetic sensor, and an object of the invention is to provide a magnetic sensor, which can be driven in a low frequency range, has high element sensitivity, consumes low power and has a dynamic range which is broad and free from variations with drive frequency.

To increase the element output, it is necessary to improve the drive magnetic field efficiency. According to the invention, a conductive layer comprising a conductive material is provided within a magnetic layer comprising a magnetic material. A layer which has a conductivity higher than that of the magnetic layer by, for instance, an order of magnitude or more, is used as the conductive layer. With this element structure, an internal magnetic field intensity distribution as shown in FIG. 4 is obtained. The field intensity is 0 Oe at the center of the conductive layer in a section normal to the longitudinal direction of the element. The absolute field intensity is increased from this center toward the magnetic layer. It is thus possible to apply the drive magnetic field effectively to the magnetic layers, which contributes to the detection of the external magnetic field Hext as magnetic permeability $\mu$. Therefore, this structure enables to improve the resolution for the field detection.

In addition, the lamination of the magnetic and conductive materials has an effect of permitting drive frequency reduction by two orders of magnitude or more, which has been impossible with the prior art techniques. This will now be described. While the impedance taken out as the element output is given by equation (2), strictly speaking it is expressed as $$Z = R_f \frac{t}{2\delta} + j\omega L_f \frac{2\delta}{t} \qquad (3)$$

$$\delta = \sqrt{\frac{2\rho}{\omega\mu}} \qquad (4)$$

$$Z = R_f \frac{t}{2\delta} + j\omega L_f \frac{2\delta}{t} = \sqrt{\omega\mu} \left( R_f \frac{t}{2\sqrt{2\rho}} + jk \frac{2\sqrt{2\rho}}{t} \right) \qquad (5)$$

where t is the thickness of the element constituted by the magnetic and conductive layers, Rf is the resistance of the element without influence of the skin effect, Lf is the inductance of the element without influence of the skin effect, and $\rho$ is the resistivity. Given as $\delta$ in equation (4) is the skin thickness as a measure of ranges in which current and magnetic field intrude into the element. As described before, the magnetic permeability $\mu$ of the magnetic material is changed by application of external magnetic field Hext to the element, as shown by equation (1) of Lf.

In the prior art techniques in which the drive frequency f ranges from 10 to 100 MHz, R and $\omega$L are alike in value, and a change in Z appears as a superimposition of both reactance $\omega$L change and resistance R change due to the application of external magnetic field Hext. However, where the drive frequency f is 1 MHz or below, the skin thickness $\delta$ is sufficiently high compared to the thickness t of the element, i.e., t<2$\delta$, because $\omega$ is low. Therefore, the skin effect type resistance change does not appear by a change in $\mu$, as is obvious from the first term of equation (5) which is obtained by substituting equations (1) and (4) into equation (3). In addition, because of the drive frequency reduction by one order of magnitude or more from the usual value (10 to 100 MHz), the reactance $\omega$L in the second term is reduced by an order of magnitude compared to the value corresponding to the usual drive frequency. Hence, with the prior art magnetic sensor element, at a drive frequency of about 1 MHz neither reactance nor resistance is changed, so that it is difficult for magnetic field detection to be obtained. According to the invention, a conductive layer comprising a conductive material is enclosed by a magnetic layer. Thus, the conductive layer which has high conductivity is electrically in parallel with the magnetic layer which comprises a magnetic material. The total resistance Rtotal of the element is thus determined as 1/Rtotal=1/Rmag+1/Rcond (6)

where Rmag is the resistance of the sole magnetic layer, and Rcond is the resistance of the sole conductive layer.

As shown, according to the invention, the resistance of the element is reduced by the provision of a conductive layer with a high conductivity, so that $\omega$L and R are alike in value even when the drive frequency is reduced by two orders of magnitude compared to the prior art. This means that the drive frequency can be in a low frequency range of 100 KHz to 1 MHz.

According to the invention, the skin thickness is reduced owing to the multilayered structure with the magnetic material having high magnetic permeability and the conductive material having high conductivity, and the skin effect is influential at low frequencies as well. Thus, the resistance R is also changed by the external magnetic field Hext in a low frequency range of 100 KHz to 1 MHz.

Considering the skin effect in the case of a multilayered element with a multilayered magnetic layer and conductive layer, with a skin thickness slightly greater than the thickness of the magnetic layer, the magnetic and conductive layers constitute a series connection with the magnetic permeability $\mu$, as is obvious from the magnetic circuit shown in FIG. 5. This means that when the magnetic permeability $\mu$ of the magnetic layer is higher than that of the conductive layer by three orders of magnitude or more, the magnetic permeability $\mu$ of the element can be regarded as being equal to the magnetic permeability of the magnetic layer. As for a current I that flows in the magnetic circuit, since the magnetic and conductive layers constitute parallel resistance as mentioned above, the resistance of the conductive layer has a predominating influence on the conductivity.

Thus, denoting the effective thickness of the conductive layer by $\delta$, the resistance of the element is determined simply as $$R = \rho_{tot} \cdot \frac{l}{w\delta} = \frac{l}{w} \sqrt{\frac{\rho_{tot}\omega\mu}{2}} \qquad (7)$$

$$\rho_{total} = \frac{1}{4} \left\{ 4\rho_c + \mu\omega t_m^2 + \frac{\mu\omega\rho_c^2 t_m^2}{\rho_m} - \frac{2\mu\omega\rho_c t_m^2}{\rho_m} + \sqrt{\mu\omega} \, (-\rho_c + \rho_m)t_m \sqrt{\frac{(8\rho_c\rho_m^2) + \mu\omega\rho_c^2 t_m^2 - 2\mu\omega\rho_c\rho_m t_m^2 + \mu\omega\rho_m^2 t_m^2}{\rho_m^2}} \right\} \qquad (8)$$

It will be seen from equation (8) that in the total resistivity (or $\rho$tot) of the element, $\rho$c of the conductive layer in the first term in the parentheses is predominant over $\rho$m of the magnetic layer. As is obvious from equation (7), the sum of the second and following terms in the parentheses in equation (8) is substantially equal to 4 $\rho$c in the first term. Thus, the change in the total resistance can be increased with the change in the magnetic permeability $\mu$ of the magnetic layer by selecting the thickness t and resistivity $\rho$ of each layer according to the drive frequency $\omega$ such that the range, in which the skin thickness $\delta$ can be changed with change in the magnetic permeability $\mu$, extends into the magnetic layer only.

A further effect is that, unlike the prior art, total resistivity is changed greatly because the magnetic permeability $\mu$ of the magnetic layer that is used is high and also because the skin effect is extremely influential on the conductive layer, which has a significant effect on the element resistance change. To obtain this skin effect, the thickness ratio between the conductive and magnetic layers may be in a range of 3:1 to 1:5.

In this case, since the skin effect is less influential on the magnetic layer, the impedance Z is expressed, in terms similar to equation (4), as $$Z = R(-t/2\sqrt{[2\rho]})\sqrt{[\omega\mu]} + jk(2\sqrt{[2\rho]}/t)\omega\mu \qquad (9)$$

It will be understood that the rate of change in the reactance in the right side second term with respect to the angular frequency $\omega$ and magnetic permeability $\mu$ is high.

As shown, according to the invention, the lamination of the magnetic and conductive layers provides an effect of permitting highly sensitive detection of the external magnetic field in the magnetic layer and high efficiency conversion of the detected magnetic field into a resistance change in an effective region of the skin depth in the width direction of the conductive layer covered with the magnetic layer. That is, owing to the magnetic and conductive multilayer effects, the external magnetic field is detected with high sensitivity in the magnetic layer to be converted at high efficiency into the corresponding resistance change in the skin thickness of the conductor covered with the magnetic layer. Thus, not only the inductance L but also the resistance R can be changed greatly with a change in the external magnetic field. According to the invention, it is possible with an element having a thickness of 10 μm or less, to increase the rate of change in R by more than one order of magnitude in a frequency range of 100 KHz to 1 MHz in accordance with the change of the external magnetic field.

In the prior art single amorphous film case, the dynamic range is subject to variations with the drive frequency. According to the invention, an element with a stable dynamic range irrespective of the drive frequency, is realized by using a magnetic layer, which provides uniform magnetic anisotropy not distributed in the element. Such a magnetic layer is formed by carrying out a thin film forming operation, such as sputtering or vacuum deposition, in the presence of a DC magnetic field. By so doing, the magnetic anisotropy in the magnetic layer is controlled to provide uniform magnetic anisotropy in the element. Furthermore, the magnetic layer can be formed by plating and then heating in the presence of a DC magnetic field.

The reason why the magnetic anisotropy determines the dynamic range of the element, will now be explained. Referring to FIG. 6, the magnetized state of the element is determined by the external magnetic field Hext, anisotropic magnetic field Hk, applied magnetic field H, and demagnetizing fields Hdy and Hdx generated inversely to Hext and H, respectively. This is used to express the total magnetic energy in the element as $$E(\theta) = -MsH\cos\theta - MsHdx\cos\theta - MsHext\sin\theta - MsHdy\sin\theta + \frac{MsHk\sin^2\theta}{2} \quad (10)$$

where Ms is the magnetization, and θ is the angle between the easy magnetization direction (easy magnetization axis direction) and the direction of magnetization. Hdx has a smaller absolute value than the drive magnetic field H. Also, it is in the opposite direction to H and has a negative polarity. Hdy and external magnetic field Hext are similarly related. θ is prescribed by the magnitude relationship of the anisotropic magnetic field Hk, external magnetic field Hext and inverse magnetic fields Hdx, Hdy and H to one another, to minimize E. In this model, the magnetic permeability μ is changed with the magnitude and direction of Hext, and also the magnitude and direction of Hk. This is reflected in the sensitivity of the element. When the anisotropic easy magnetization axis is formed in the width direction of the element, the magnetic permeability change and impedance change are increased, as shown in FIG. 7. The impedance change rate is expressed as ΔZ/Zo=(Z maximum-Z(Hext= o)/Z(Hext=o).

In addition, the dynamic range (or range of external magnetic field Hext from Hext=0 to the sensitivity polarity change of the element, i.e., range of Hext until reaching of the maximum magnetic permeability) is determined by the sum (Hk+Hs) of the anisotropic magnetic field Hk provided to the film and shape anisotropic magnetic field Hs which is determined by the balance between Hdy and Hdx.

The anisotropic magnetic field Hk can be controlled by the element formation process by thin film formation techniques such as sputtering or vacuum deposition in the presence of a magnetic field or an exchange function between magnetic layers. Furthermore, HK can be controlled by heating in the presence of a predetermined magnetic field after the magnetic layer has been formed by plating. The shape anisotropic magnetic field Hs is determined by the shape of the element (i.e., ratio between the width and length of the magnetic layer), as shown in FIG. 8. Both of anisotropic the magnetic fields, HK and Ks, are capable of stable control, and it is thus possible to control the dynamic range with thin film forming techniques.

When external magnetic field Hext is applied in a direction parallel to the substrate surface of the element, the magnetized state of the magnetic layer of the element is changed to change the width direction magnetic permeability μ of the element. A drive magnetic field is generated in the element in the width direction thereof by applying an AC current in the length direction of the conductive layer of the element, and this magnetic permeability change is detected as a change in the inductance L, resistance R, phase difference between the two, or impedance Z given as equation (5).

A drive power source is connected across the conductive layer of the element for applying a constant sinusoidal low current at 100 KHz to 1 MHz. In this state, a voltage determined by the product of the impedance Z of the element and the applied current is generated across the element. When external magnetic field Hext is applied to the element, the magnetic permeability μ thereof is changed. The resultant changes in L and R are read out as a change in impedance Z from the peak value of the voltage, whereby the intensity of the external magnetic field Hext is detected.

According to the invention, it is possible to increase the efficiency of detecting the change in the inductance L in a low drive frequency range of 100 Hz to 1 MHz, which is lower by a couple of orders of magnitude compared to with the prior art techniques, and indeed has been impossible with the prior art techniques, with the lamination of the magnetic and conductive layers. At the same time, since the element structure has a feature that the effective region of the skin effect is influential only on the sole conductive layer which greatly contributes to the element resistance, the efficiency of detection of the change in R is also increased to increase the output of the element by between one and two orders of magnitude, and also to reduce power consumption by one order of magnitude compared to the prior art.

Thin film formation techniques and magnetic anisotropy control in dependence on the element shape are further provided so as to improve the control of the dynamic range of the element and also to make the dynamic range stable irrespective of drive frequency changes.

As shown, according to the invention, the magnetic sensor element is formed by separately laminating the magnetic and conductive layers to make use of the features of the individual layers and also to attain sensitivity improvement of the element with specific effect of the lamination. Specifically, according to the invention the magnetic layer of a magnetic material covers the conductive layer of a conductive material, whereby the resistance of the element is reduced by two orders of magnitude. It is thus possible to increase the impedance detection efficiency and reduce the power consumption by one order of magnitude compared to the prior art. Moreover, the lamination of the magnetic and conductive layers permits high sensitivity detection of the external magnetic field with the magnetic layer, and also high efficiency conversion of the detected magnetic field into a resistance change, utilizing the skin depth of the conductor in lamination with the magnetic layer. By appropriately selecting the thickness ratio between the two layers, it is possible, even with an element having a thickness of 10 µm or less, to obtain magnetic field detection at a drive frequency of 100 KHz to 1 MHz, which is lower by two orders of magnitude and has been impossible with the prior art techniques. It is further made possible not only to obtain changes in the inductance, but also to make the resistance greater by an order of magnitude compared to the prior art. Particularly, it is made possible to increase the sensitivity at a low frequency of 100 KHz by two orders of magnitude or more compared to the prior art.

Thus, when the magnetic sensor is used within a vehicle, the noise wave generation problem can be alleviated. That is, measures to cope with noise interfering with an engine control computer can be reduced, and the element circuit may be inexpensive, thus leading to cost reduction of the whole system using the magnetic sensor.

A further obtainable effect is that it is made possible to improve the dynamic range of the element and the stability of the dynamic range irrespective of drive frequency changes through control of the magnetic anisotropy of the magnetic layer with a thin film formation technique wherein a magnetic film is formed in the presence of a DC magnetic field. Magnetic anisotropy is exploited in an element for determining the magnetic field corresponding to the maximum output in an output characteristic of the element (i.e., output versus external magnetic field characteristic). It is possible to either reduce or increase the detectable magnetic field intensity range of the element by separately forming the conductive and magnetic layers and independently controlling the magnetic characteristics of the magnetic layer. By reducing the detectable range by reducing the magnetic anisotropy, the output per unit magnetic field intensity can be increased, so that it is possible to construct an absolute value type magnetic sensor having high resolution compared to the prior art. By increasing the detectable range by increasing the magnetic anisotropy, on the other hand, such design barriers as the design accuracy of peripheral apparatuses constituting the sensor system or the clearance between the element and a magnetic field generator element, can be greatly removed, so that it is possible to produce systems using automotive vehicle height sensors or position sensors, which have far simpler and more inexpensive structures compared to the prior art.

Where the magnetic layer is of a ferromagnetic material such as Fe or Co, since the conductive layer is still of a conductive material with a conductivity higher than that of the magnetic layer by an order of magnitude or more, in addition to obtaining the above effects, owing to the fact that the conductive and magnetic layers are both of magnetic material, uni-axial magnetic anisotropy control can be obtained with strong magnetic coupling of the two layers. Thus, further expansion of the dynamic range can be attained at the same time.

Since all these elements are formed as thin films, by selecting Si for the substrate it is possible to facilitate making the element integral with a signal processing circuit formed on the Si substrate.

A different structure of the magnetic sensor element according to the invention comprises a conductive layer of a low resistivity material for flowing a necessary energizing current, a magnetic layer enclosing the conductive layer, and an insulating layer provided between the conductive and magnetic layers.

The insulating layer allows energizing current to flow in the sole conductive layer for efficient generation of magnetic flux linking with the magnetic layer.

Besides, by setting the width of the conductive layer to 100 µm or above, it is possible to obtain pronounced generation of the width direction skin effect. Moreover, by imparting magnetic anisotropy on the magnetic layer such that the easy magnetization direction is in the width direction of the element, a sharp impedance change may be caused by an external magnetic field.

Now, provision of the insulating layer will be described. Where no insulating layer is provided between the magnetic and conductive layers, the energizing current partly flows into the magnetic layer. The current flowing into the magnetic layer does not contribute to the generation of magnetic flux linking with the magnetic layer. In other words, when the energizing current supplied to the element partly flows into the magnetic layer, the current in the conductive layer becomes less than the energizing current, that is, the energizing current is no longer effectively used for the generation of the magnetic impedance effect. With the insulating layer provided between the conductive and magnetic layers, the energizing current flows through the sole conductive layer. In this case, the energizing current is entirely used to generate the magnetic flux linking with the magnetic layer, so that it is possible to obtain a more pronounced magneto-impedance effect.

The impedance change caused by the external magnetic field consists of a reactance inductance change and a resistance change. The inductance change corresponds to change in magnetic flux linking with the magnetic layer shown in FIG. 9 (i.e., cycling magnetic flux Φ1 shown in FIG. 9). The insulating layer provides for a sufficiently large inductance change, thus increasing the magnetic field detection sensitivity.

The setting of the element width to 100 µm or above will now be described. The change in the resistance due to the external magnetic field corresponds to a change in the leakage flux linking with the conductive layer between upper and lower magnetic layers (i.e., leakage magnetic flux Φ2 shown in FIG. 9). This leakage flux generates a skin effect in the conductive layer. The skin effect appears as a change in the resistance.

For pronounced generation of the resistance change, it is important that the conductive layer has a width which is at least equal to the skin depth and that considerable magnetic flux is generated which vertically extends through the conductive layer. The mechanism of the resistance change generation by the skin effect will be described along with how to cause the skin effect generation in the low frequency range of 100 KHz to 1 MHz.

The skin effect is generally generated by the following mechanism. The leakage flux from the magnetic layers extends vertically through the conductive layer. This magnetic flux generates an eddy current. The eddy current thus generated causes the energizing current to exist in opposite ends of the conductive layer, as shown in FIG. 10. This eventually causes generation of the skin effect.

Now, conditions necessary for the skin effect generation in the conductive layer will be described. The layered structure enhances the skin effect in the conductive layer. As a measure of the skin effect, it is necessary to consider a quantity δ representing the skin depth (i.e., effective current flow depth). The skin depth is, as shown by equation (4), $$\delta = \sqrt{[2\rho/\omega \cdot \mu]}$$

and is closely related to the resistivity of the conductive layer and the frequency of the energizing current. For example, the skin depth is reduced with increasing frequency of the energizing current. ρ is the resistivity of the conductive layer, ω is the magnetic permeability of the conductive layer, and μ is the angular frequency of the energizing current.

The conductor thickness and the skin depth are related to the skin effect generation, such that the skin effect is generated when the skin depth is less than the conductor thickness, and is not generated when the former is greater than the latter. Thus, pronounced skin effect generation can be obtained by reducing the skin depth, by increasing the energizing current frequency, or by increasing the conductor thickness.

The skin effect is attributable to the eddy current generated by the magnetic flux vertically extending through the conductive layer. Thus it is important, for pronounced skin effect generation, to set the width of the conductive layer to be at least the skin depth. Where the standard material, i.e., Al or Cu, is used as the conductive layer, the skin depth is about 80 μm to 100 μm in an energizing current frequency range of 100 KHz to 1 MHz. Thus, with a conductive layer width of 100 μm or above, the skin effect can obviously be sufficiently generated in the energizing current frequency range of 100 KHz to 1 MHz as well.

Since uniform magnetic anisotropy can be imparted to the magnetic layer by film formation in the presence of a magnetic field, it is possible to obtain control of domains in the magnetic layer as shown in FIG. 11. Such controlled domains are caused to undergo similar change by external magnetic field, so that a sharp magnetic permeability change is obtained with the external magnetic field. This sharp magnetic permeability change causes the magnetic flux Φ1 linking with the magnetic layer and the magnetic flux Φ2 leaking from the magnetic layer to be changed sharply. Eventually, it appears as large reactance and resistance changes with respect to the external magnetic field.

As shown, a pronounced magnetic impedance effect with an impedance change rate of 100 % or more can be obtained with respect to a low magnetic field intensity of several Oe in a low frequency range of 1 MHz and below.

DETAILED DESCRIPTION OF THE PREFERRED EMBODIMENTS

Preferred embodiments of the invention will now be described with reference to the drawings.

BASIC STRUCTURE 1

Figure 1:
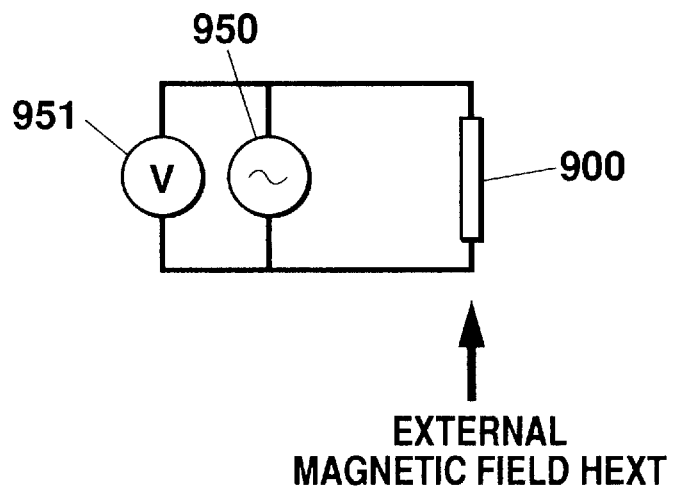
FIG. 1 is a view showing a prior art magnetic sensor.
Figure 2:
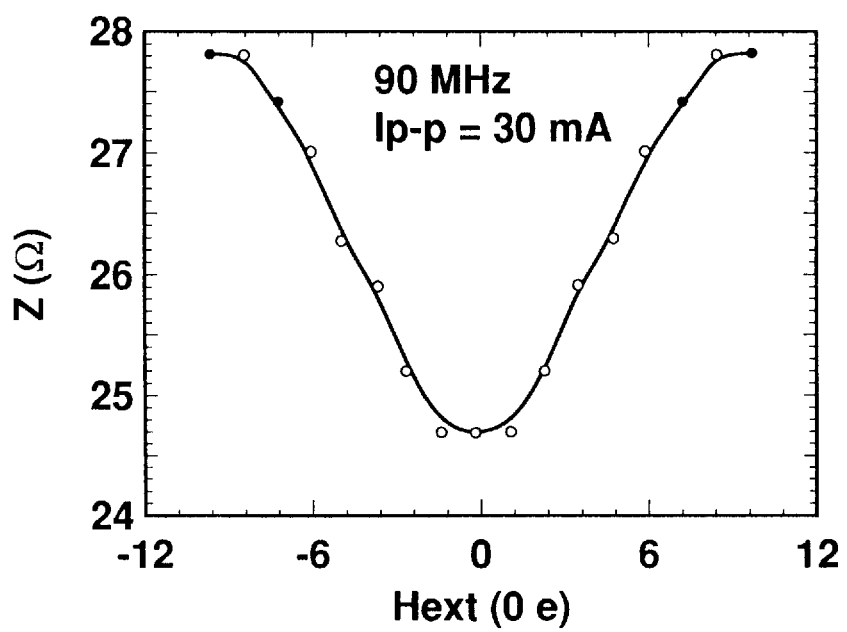
FIG. 2 is a graph showing a characteristic in the prior art.
Figure 3:
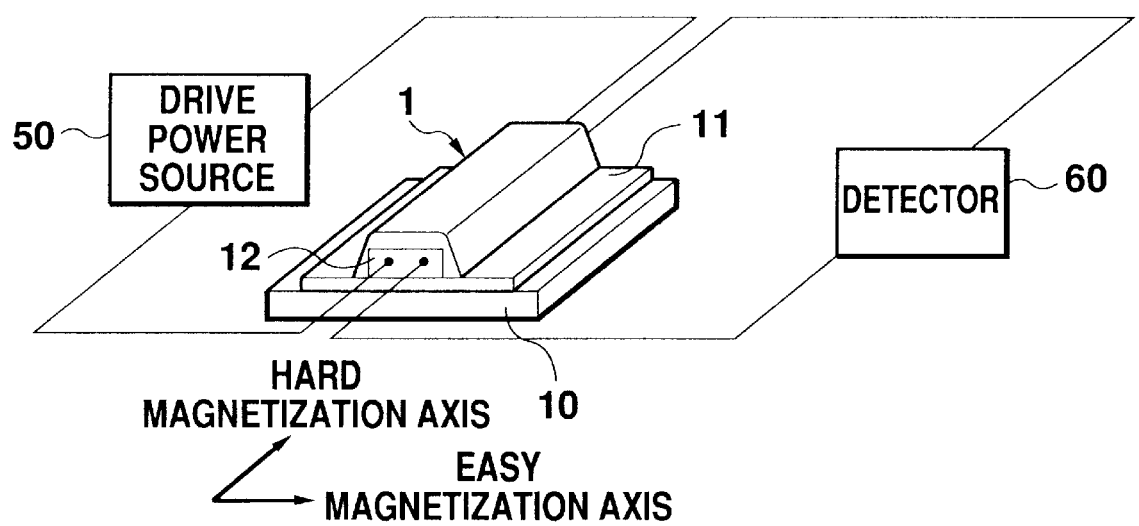
FIG. 3 is a view showing Basic Structure 1 according to the invention.
Figure 4:
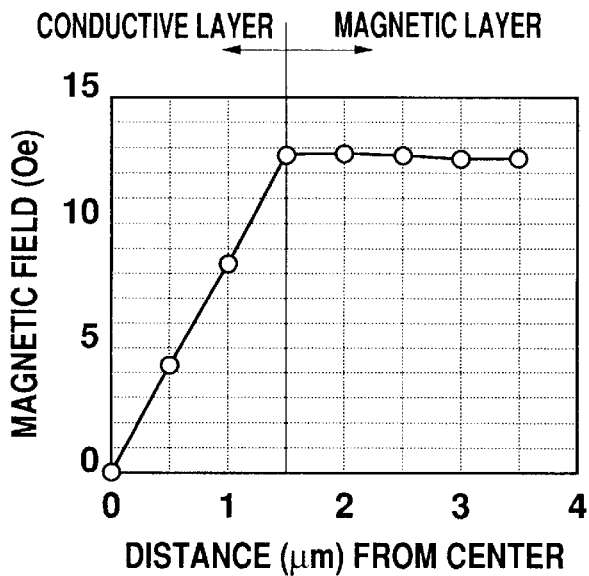
FIG. 4 is a graph showing a magnetic field characteristic of the inside of an element in an embodiment of the invention.
Figure 5:
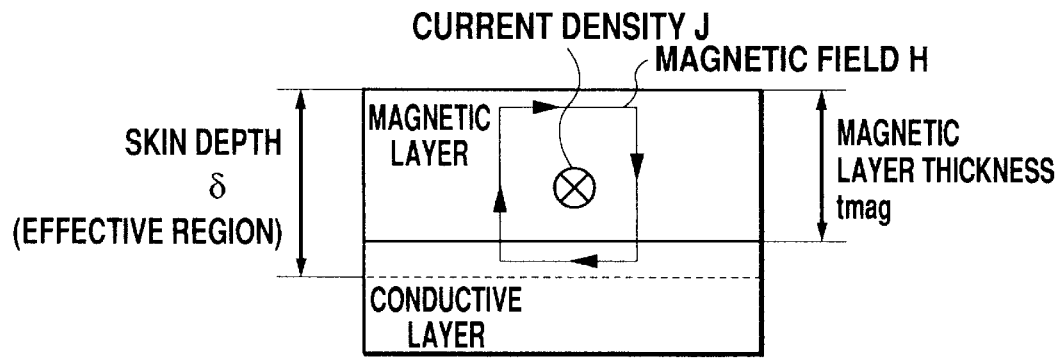
FIG. 5 is a view showing the state of a magnetic field set up in an embodiment of the invention.
Figure 6:
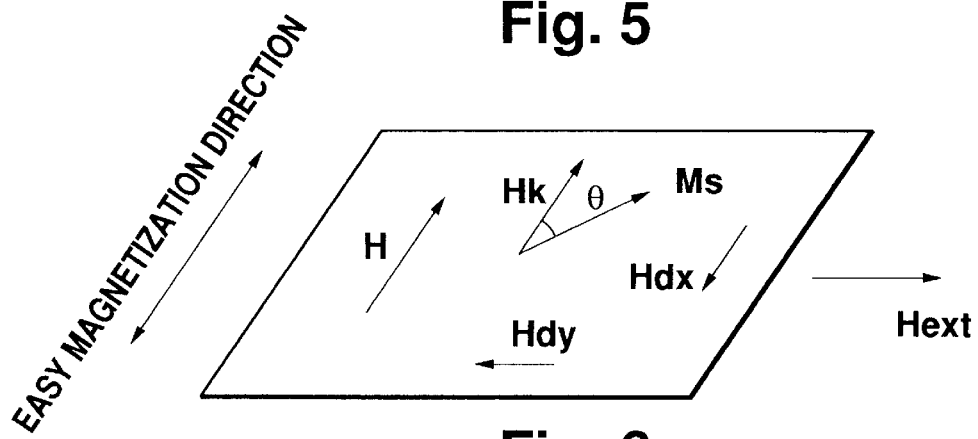
FIG. 6 is a view showing direction of magnetization.
Figure 7:
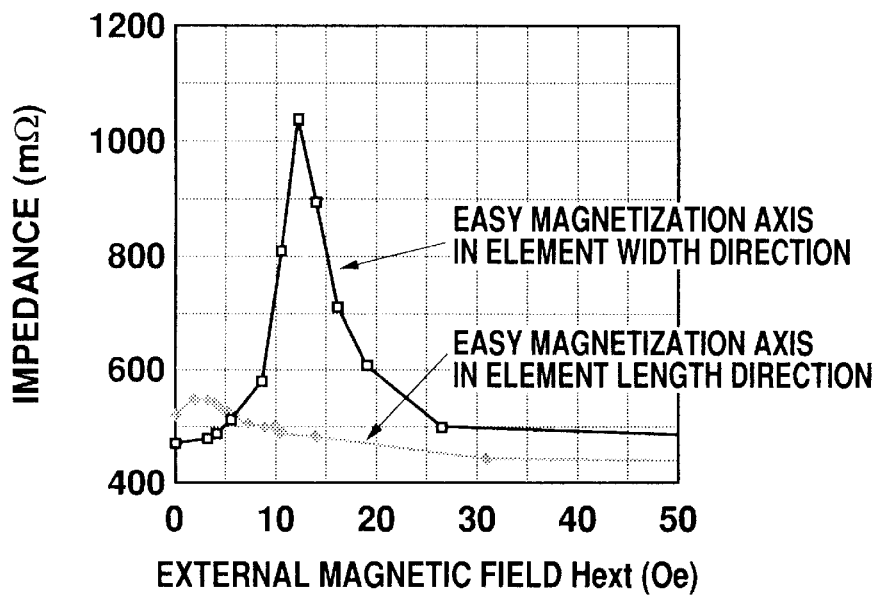
FIG. 7 is a graph showing the relation between impedance and external magnetic field.
Figure 8:
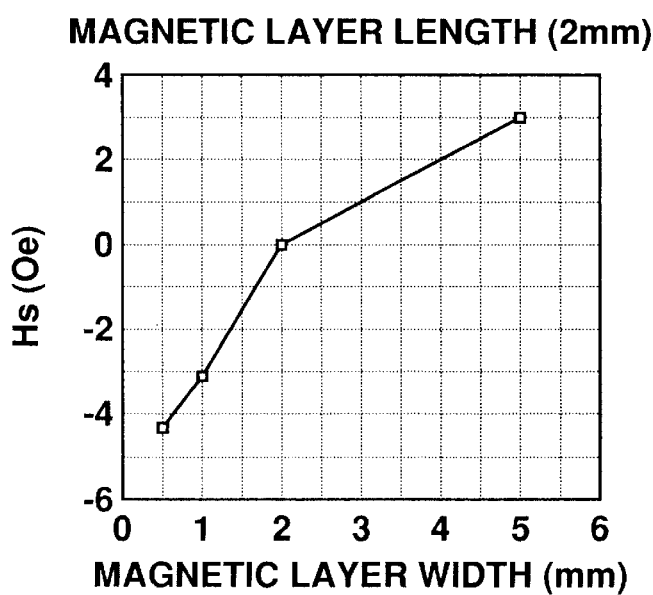
FIG. 8 is a graph showing the relationship between magnetic field and width of a magnetic layer.
Figure 9:
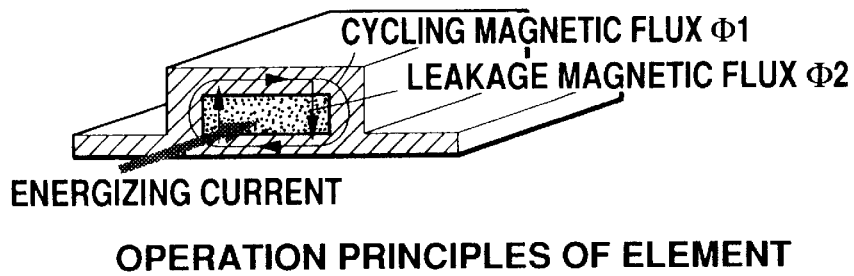
FIG. 9 is a view illustrating the principles underlying the operation of an element.
Figure 10:
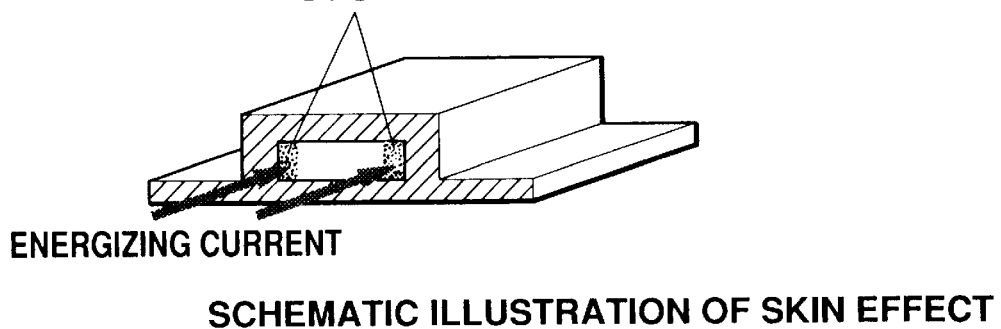
FIG. 10 is a view illustrating the skin effect.
Figure 11:
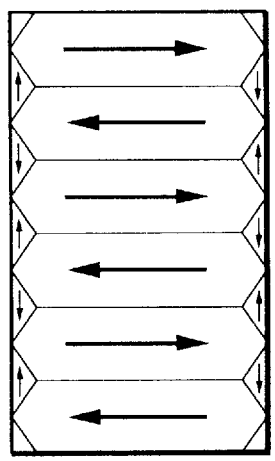
FIG. 11 is a view showing domains in magnetic film surface.

FIG. 3 shows a basic structure of the magnetic sensor element according to the invention. The illustrated element 1 has a multilayered structure having a magnetic layer 11 enclosing a conductive layer 12, the multilayered structure being formed on a silicon substrate 10. The conductive and magnetic layers 12 and 11 are in direct contact with each other. The magnetic layer 11 is formed using an amorphous soft magnetic material, e.g., FeCoSiB, CoSiB, etc. The conductive layer 12 is formed using a conductor with a higher conductivity than that of the magnetic layer 11 by an order of magnitude or more, e.g., Cu, Al, Ag, etc. The layers 11 and 12 are formed by thin film formation techniques, such as a vacuum deposition process or a sputtering process. The magnetic layer 11 is formed in the presence of a DC magnetic field applied in the width direction of the element. The width direction of the element is the easy magnetization direction of the magnetic layer 11. The magnetic layer 11 may also be formed by plating followed by heat treatment in the presence of a magnetic field, for easy magnetization direction control.

Figure 12:
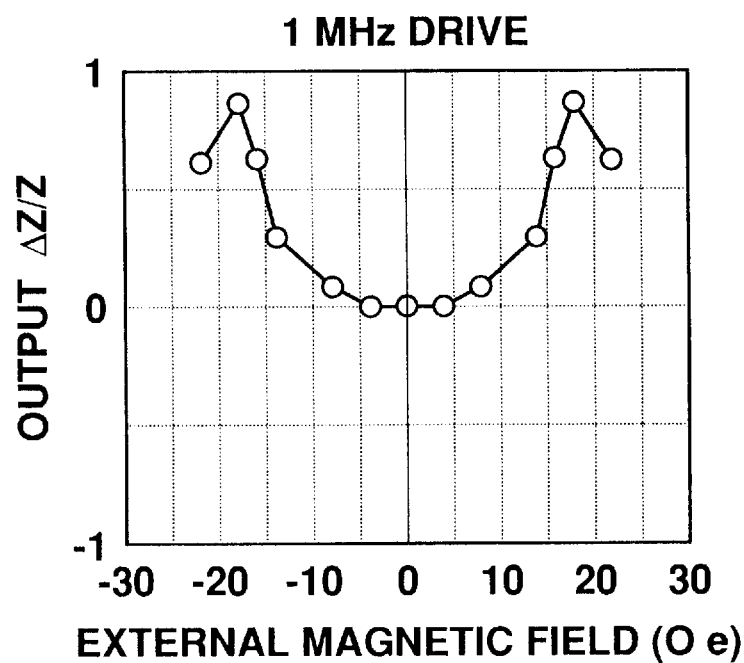
FIG. 12 is a graph showing the relationship between output and external magnetic field.

The element operates as follows. A drive power source 50 is coupled between the opposite ends of the conductive layer or both of the conductive and magnetic layers. When an external magnetic field to be detected is applied to the element in the presence of the AC drive magnetic field set up by the AC drive current in the width direction of the element, the resistance R and reactance $X(=\omega L)$ of the element are changed with a change in the magnetic permeability caused by the external magnetic field. A detector 60 detects this change as a change in the resistance, reactance, phase difference between the two, or impedance. FIG. 12 shows an example of changes in impedance.

Figure 13:
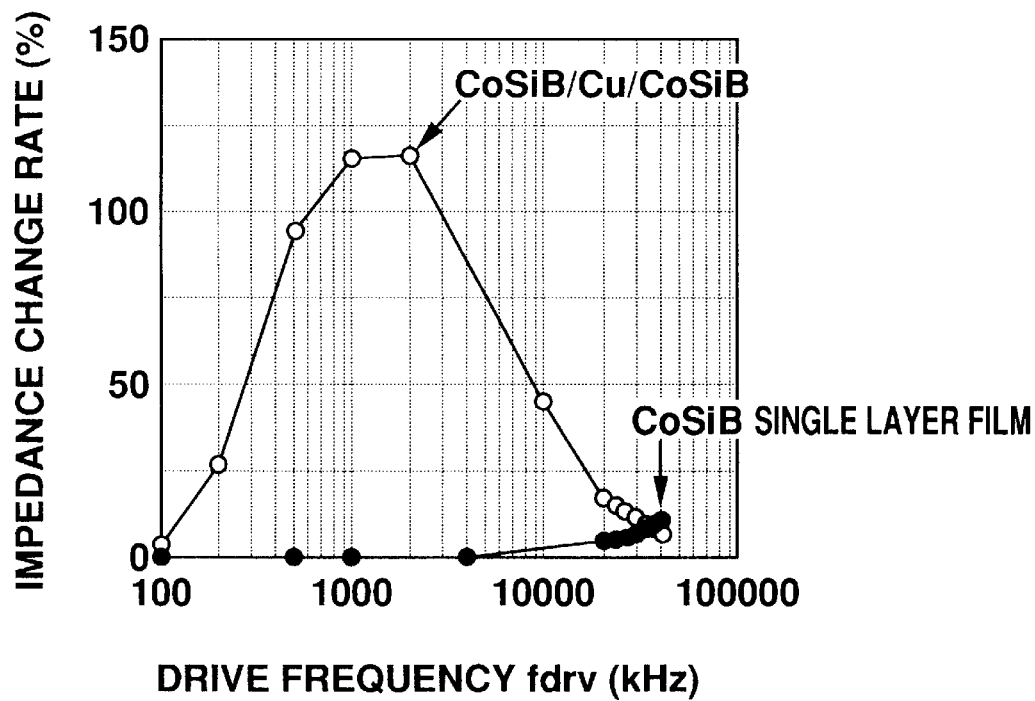
FIG. 13 is a graph showing the relationship between rate of change in impedance and drive frequency.

As shown in FIG. 13, very large impedance changes are obtained at 100 KHz to 2 MHz compared to prior art thin film elements with thicknesses of 10 $\mu$m and below. This constitutes a sensitivity improvement of two orders of magnitude or more at drive frequencies two orders of magnitude lower than in the prior art.

BASIC STRUCTURE 2

Figure 14:
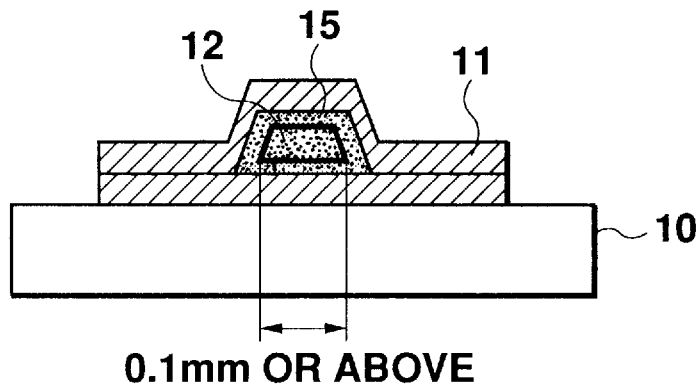
FIG. 14 is a view showing Basic Structure 2 according to the invention.

FIG. 14 shows another basic structure of the magnetic sensor element according to the invention. Like Basic Structure 1 described above, the element 1 has a multilayered structure formed on a silicon substrate 10 and having a magnetic layer 11 enclosing a conductive layer 12. In this structure, an insulating layer 15 is provided between the conductive and magnetic layers 12 and 11. The width of the conductive layer 12 is set to 100 $\mu$m or above. The magnetic layer 11 is formed in the presence of a DC magnetic field applied in the width direction of the element, and the width direction of the element is the easy magnetization direction of the magnetic layer 11. That is, the easy magnetization axis of the magnetic layer 11 is at an angle of 90° to the current application direction.

Like the previous structure, a drive source is connected between the opposite ends of the conductive layer 12 of the element. When an external magnetic field is applied to the element in this state, the resistance R and reactance $X(=\omega L)$ of the element are changed with a change in the magnetic permeability caused by the applied external magnetic field. The detector detects this change as a change in the resistance, inductance, reactance, phase difference between the two, or impedance of the element.

Figure 15:
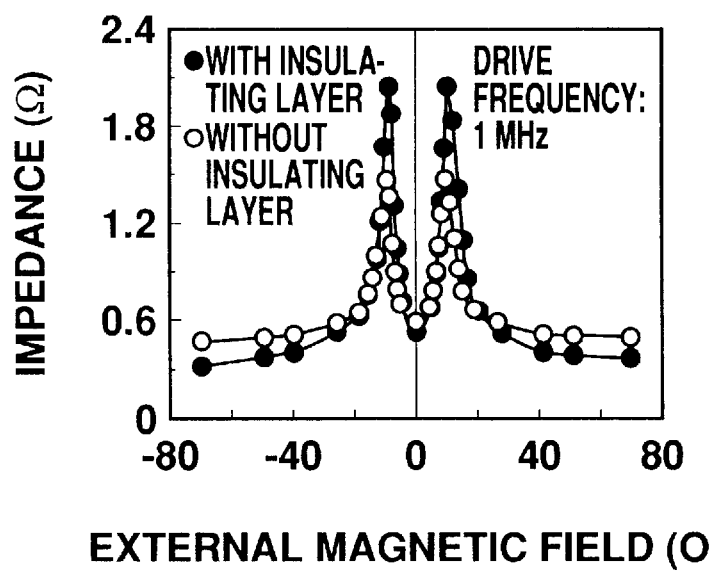
FIG. 15 is a graph showing the relationship between impedance and external magnetic field.
Figure 16:
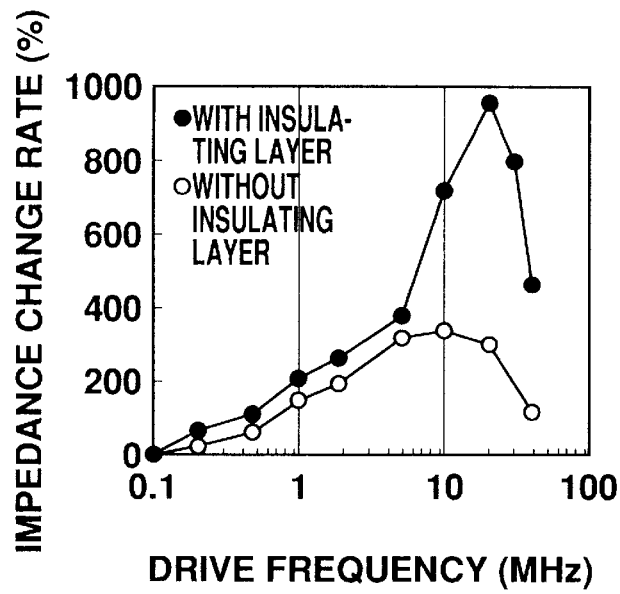
FIG. 16 is a graph showing the relationship between rate of change in impedance and drive frequency.

FIG. 15 shows the relationship between the impedance of the element in the present basic structure and the applied external magnetic field. Compared to the element of the previous Basic Structure 1, in which no insulating layer is provided between the magnetic and conductive layers and the width of the conductive layer is 100 $\mu$m or below, the change in impedance with respect to the external magnetic field application is increased by about three times, i.e., by about 900%. FIG. 16 shows the rate of change in impedance versus the element current frequency (i.e., drive frequency). As is seen, high impedance change rates can be obtained in a frequency range lower than 1 MHz as well, compared to the element in Basic Structure 1.

EMBODIMENT 1

Figure 17:
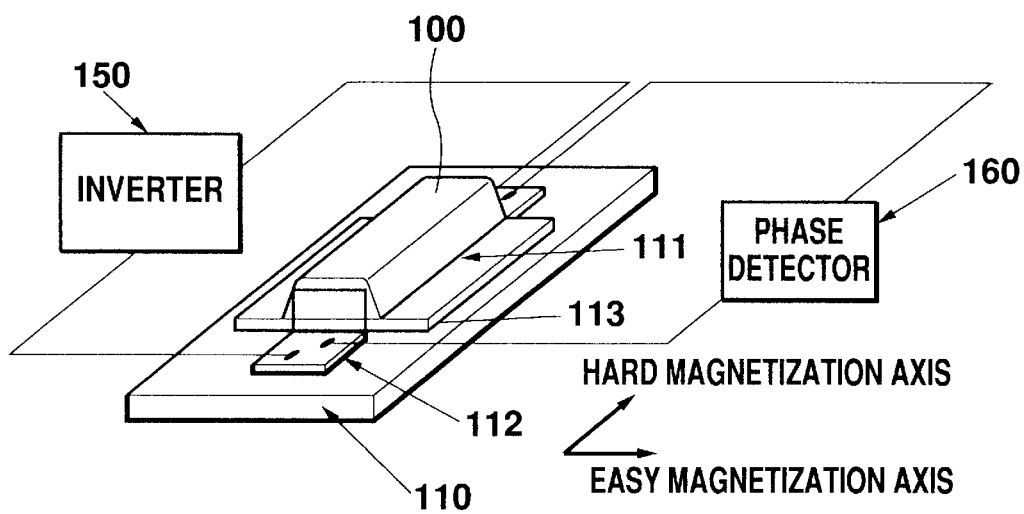
FIG. 17 is a view showing Embodiment 1 of the invention.

FIG. 17 shows a perspective view of the magnetic sensor element in Embodiment 1 according to the invention. The element 100 as illustrated comprises a silicon single crystal substrate 110, on which an upper layer 111, a conductive layer 112 and a lower layer 113 are formed. The upper and lower layers 111 and 113 constitute a magnetic layer. The upper and lower layers 111 and 113 have a length of 10 mm and a width of 1 mm. The portion of the conductive layer 112 between the upper and lower layers 111 and 113 has a thickness of 2 $\mu$m. The conductive layer 112 has a length of 10 mm, a width of 500 $\mu$m and a thickness of 3 $\mu$m.

The individual layers 111 to 113 are formed by thin film formation techniques, such as the vacuum deposition process. The substrate 110 and the lower surface of the lower layer 113 are likewise in close contact with each other. The upper layer 111 constituting the magnetic layer is formed using FeCoSiB amorphous soft magnetic material with a coercive force of 1 Oe or below, and its easy magnetization axis is directed in the width direction of the element 100. The conductive layer 112 is formed using Cu. The conductive layer 112 of the element 100 has a greater length than the upper layer 111, and its opposite ends in the length direction of the element 100 constitute wiring electrodes.

The element 100 is bestowed with uni-axial magnetic anisotropy determining the dynamic range by forming the layers in the presence of a DC magnetic field applied in the width direction of the element 100. The dynamic range of the element 100 is set to ±18 Oe by appropriately setting the applied DC magnetic field and is dependent on the shape effect that is determined by the length and width of the element 100. A drive source (i.e., inverter) 150 for pulse wave generation is connected between the opposite ends of the conductive layer 112 of the element, and a phase detector 160 is connected in parallel with the drive source 150.

Figure 18:
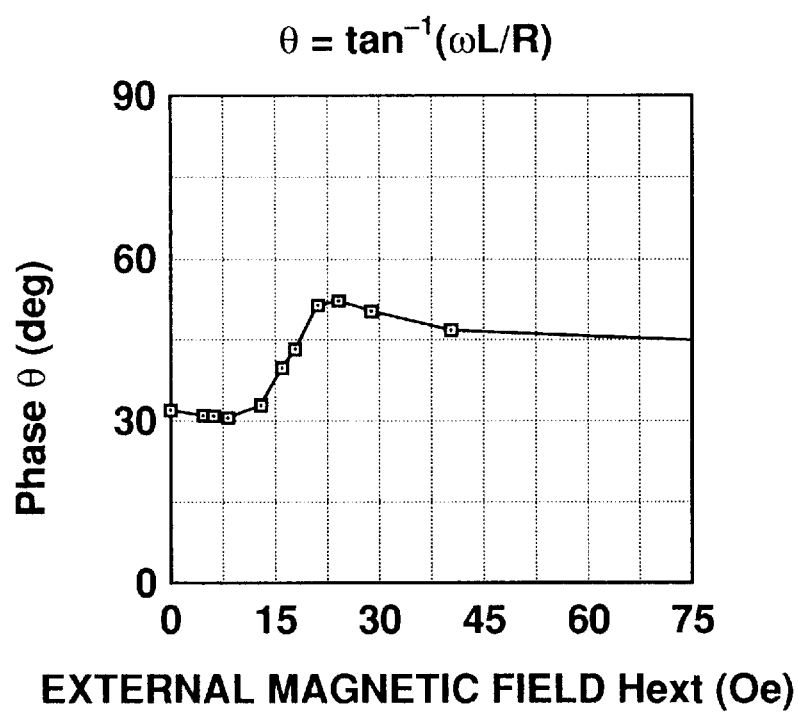
FIG. 18 is a graph showing the relationship between phase angle and external magnetic field.

The operation of the element 100 will now be described. The inverter 150, which is connected between electrodes at the opposite ends of the conductive layer 112, applies an AC current at 100 KHz between the opposite ends of the conductive layer 112. Then, the voltage between the opposite ends of the conductive layer 112 is detected, whereby changes in the resistance R and inductance L of the element 100 cause a phase change. FIG. 18 shows an output characteristic with respect to phase angle $\theta$ when an external magnetic field is applied in the length direction of the element 100. The phase angle $\theta$ is thus changed linearly with respect to the external field Hext applied to the element 100. The dynamic range is spread upward and downward with respect to controlled anisotropic magnetic field Hk. In the element 100 of the present embodiment, the anisotropic magnetic field Hk is controlled to be uniformly high in intensity in the thickness direction of the layers. The intensity of the applied external magnetic field that corresponds to the impedance peak of the element is ±18 Oe, and the phase change of the external magnetic field can be detected with respect to this point. The magnetic field intensity coverage for detection is as large as about five times that in the case of the prior art single layer.

The sensitivity (i.e., phase angle change corresponding to external magnetic field intensity change) of the element at 100 KHz is 2.5 degrees/Oe as its maximum value. Besides, the impedance when the external magnetic field intensity is zero, is reduced from 9000 m$\Omega$ in the case of the single layer to 450 m$\Omega$, and the power consumption of the element is reduced to $\frac{1}{20}^{th}$, which is a very low value. In the present element, the conductive layer 112 may be either a ferromagnetic material, e.g., Fe, Co, etc., or an anti-ferromagnetic material, e.g., NiO, CoO, etc., so long as it has 10 or more times the conductivity of the magnetic layer. The magnetic layer may also be amorphous soft magnetic material such as CoSiB, CoNbZr, etc. with a coercive force of 1 Oe or below.

EMBODIMENT 2

Figure 19:
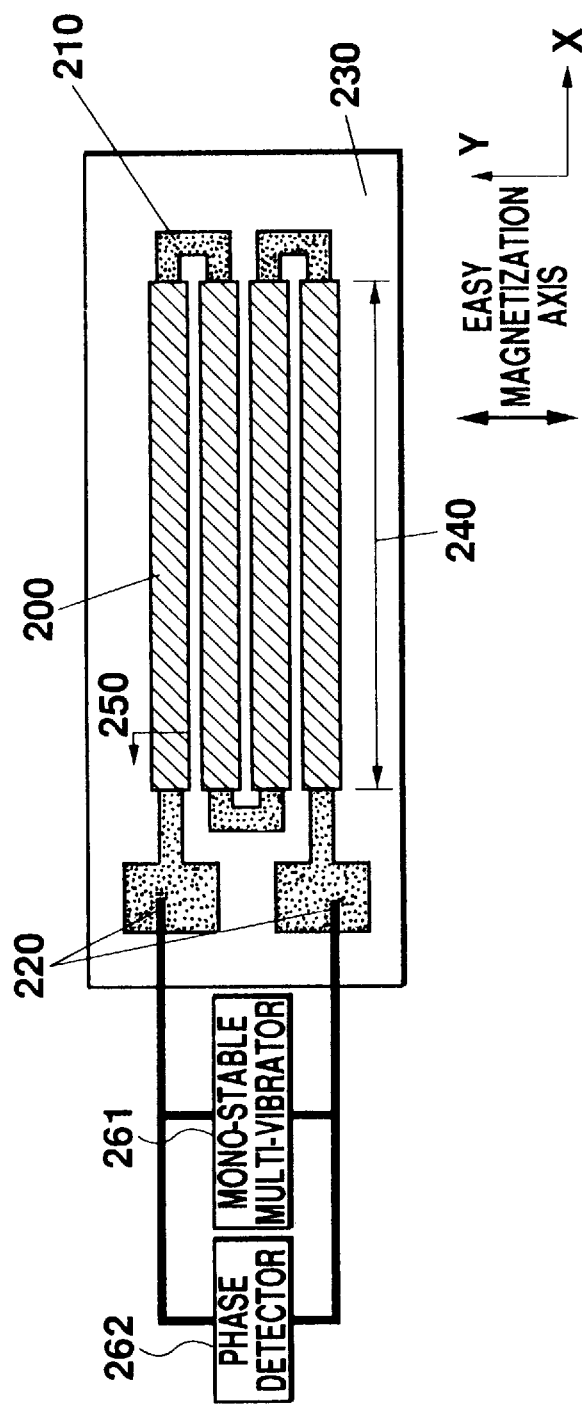
FIG. 19 is a view showing Embodiment 2 of the invention.
Figure 20:
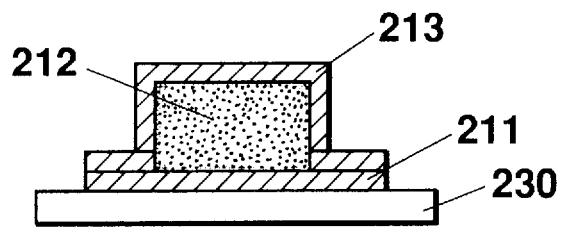
FIG. 20 is a sectional view of an element.

FIG. 19 shows Embodiment 2 of the invention. The Figure is a plan view of the element 200. FIG. 20 shows a section of the element 200 taken along line 250 in FIG. 19. In this Embodiment 2, the element 200 is formed on a silicon substrate 230 using photo-lithographic techniques. As shown in FIG. 19, the element 200 has a fine meandering line 210 with a multilayered structure. Bonding pads 220 for wiring are formed at opposite ends of the line 210. The laminated structure is formed only on an area 240, in which parallel runs of the line 210 extend in the X direction. The laminated structure includes a lower layer 211, a conductive layer 212 and an upper layer 213. In the other areas, the line is constituted by the sole conductive layer 212.

As for the dimensions of the element 200, the conductive layer 212 has a width of 50 μ, the laminated structure has a length of 3 mm, and the distance between two adjacent runs of the conductor layer 212 is 150 μm. The upper and lower layers 211 and 213 are of CoSiB and have a thickness of 3 μm. The conductive layer 212 is of Cu and has a thickness of 1 μm. The easy magnetization axis of each layer is directed in the Y direction. The anisotropic magnetic field Hk is set to 18 Oe.

Figure 21:
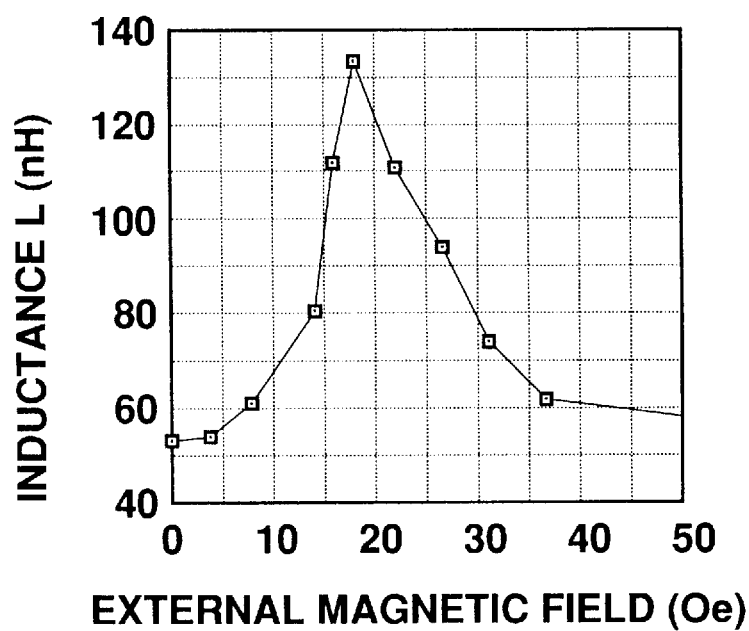
FIG. 21 is a graph showing the relationship between inductance and external magnetic field.

As shown in FIG. 20, the laminated structure of the line 210, including the upper layer 211, conductive layer 212 and upper layer 213, is formed on a silicon substrate 230. As shown in FIG. 19, a mono-stable multi-vibrator 261 as a drive, and a phase detector 262, are connected to the bonding pads 220. When the mono-stable multi-vibrator 261 drives the element under conditions of 1 MHz and 10 mA, the inductance L of the element 200 is changed as shown in FIG. 21. The element 200 has a dynamic range of 0 to 18 Oe, which is determined by the shape effect and the magnetic anisotropy. In this embodiment, the upper and lower layers 211 and 213 are imparted with the magnetic anisotropy by a heat treatment in a predetermined DC magnetic field after the fabrication of the element.

EMBODIMENT 3

Figure 22:
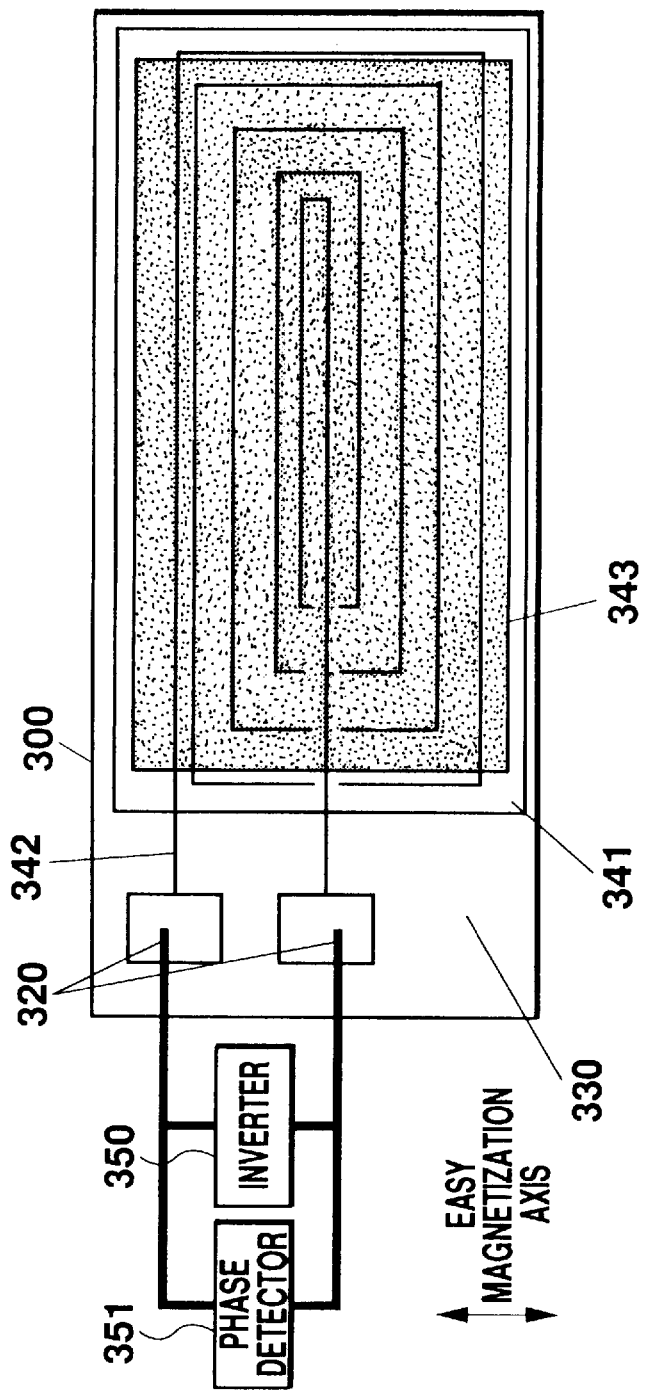
FIG. 22 is a view showing Embodiment 3 of the invention.

FIG. 22 shows Embodiment 3 of the invention. The element 300 has dimensions of 2 mm×10 mm, and it is formed spirally on a silicon single crystal substrate 330. Bonding pads 320 for wiring are formed at the opposite ends of the element 300. In the element 300, the lower and upper layers are of CoSiB, and the conductive layer is of Cu. The element 300 has a width of 10 μm and a thickness of 2 μm. The easy magnetization axis of the element is directed in the width direction thereof. An inverter 350 and a phase detector 351 are connected in parallel between the paired bonding pads 320.

Figure 23:
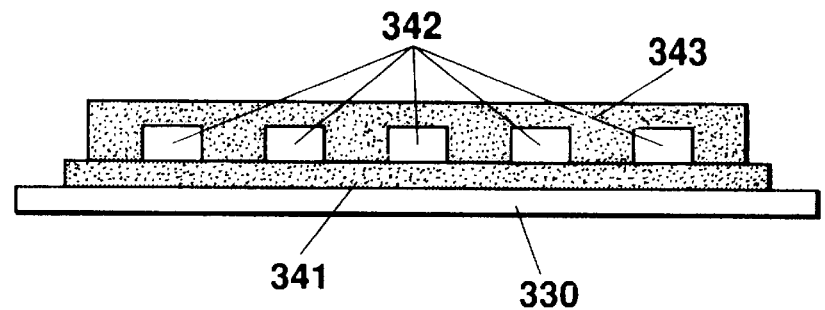
FIG. 23 is a sectional view of an element.

FIG. 23 is a sectional view showing an essential part shown in FIG. 22. The conductive layer 342 of Co is formed on the lower layer 341 and enclosed by the lower and upper layers 341 and 343.

EMBODIMENT 4

Figure 24:
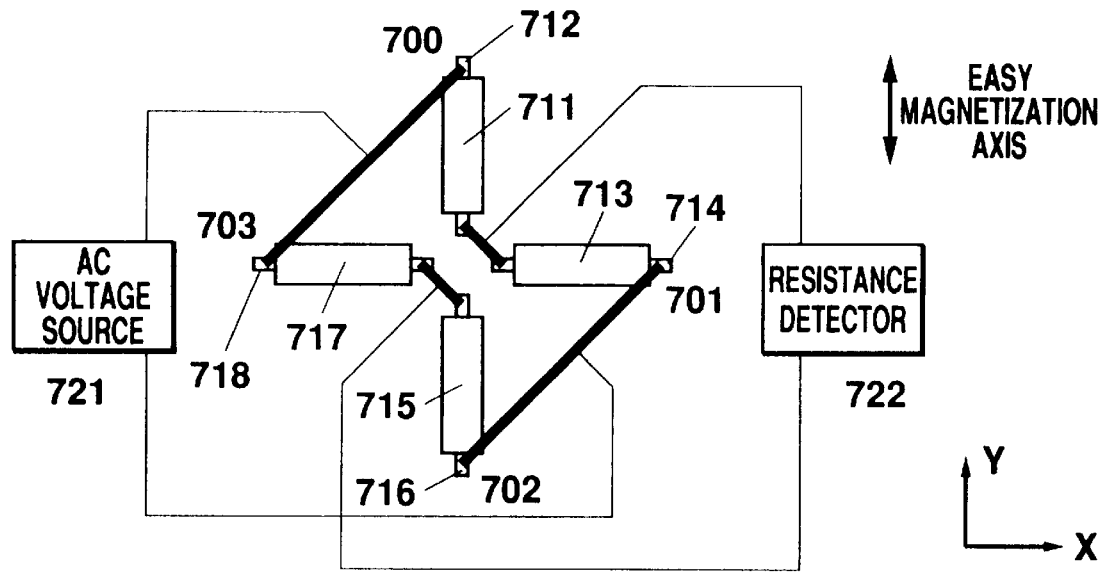
FIG. 24 is a view showing Embodiment 4 of the invention.

FIG. 24 shows Embodiment 4 of the invention. In this embodiment, elements 700 to 703, having magnetic layers 711, 713, 715 and 717, and conductive layers 712, 714, 716 and 718, respectively, are arranged in a bridge connection. A high frequency voltage source 721 and a resistance detector 722 are connected to the bridge connection. The elements 700 and 702 have their length direction directed in the Y axis direction, and the elements 701 and 703 have their length direction directed in the X axis direction. The elements 700 and 703 have their outer terminals connected to each other, and the elements 701 and 702 have their outer terminals connected to each other. The elements 700 and 701 have their inner terminals connected to each other, and the elements 702 and 703 have their inner terminals connected to each other. The constant voltage source 721 is connected between the outer terminal side of the elements 700 and 703 and the outer terminal side of the elements 701 and 702. The resistance detector 722 is connected between the inner terminal side of the elements 700 and 701 and the inner terminal side of the elements 702 and 703.

Figure 25:
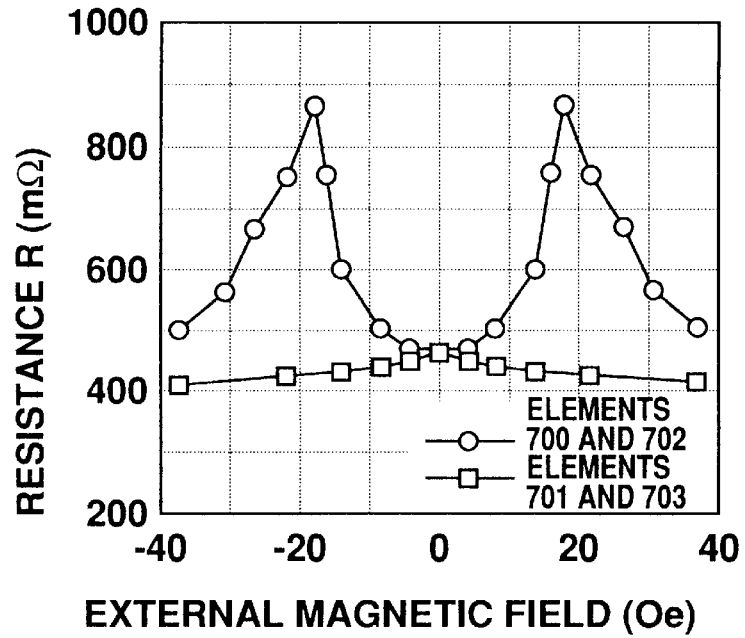
FIG. 25 is a graph showing the relationship between resistance and external magnetic field.

As for the dimensions of the four elements 700 to 703, upper and lower magnetic layers 711, 713, 715 and 717 have a width of 1 mm, a length of 5 mm and a thickness of 2 μm, and conductive layers 712, 714, 716 and 718 have a width of 0.1 mm, a length of 6 mm and a thickness of 3 μm. The magnetic layers are of FeCoSiB, and the conductive layers are of Co. As for the magnetic anisotropy of all the magnetic layers 711, 713, 715 and 717, the easy magnetization axis is directed in the Y axis direction (i.e., vertical direction in the Figure) which is the length direction of the elements 700 and 702. This means that the group of elements 700 and 702 and the group of elements 701 and 703 have different output characteristics with respect to the X axis direction external magnetic field Hext. This is shown in FIG. 25.

As shown in FIG. 24, the easy magnetization axis directions of the group of elements 700 and 702 and the group of elements 701 and 703 are in a 90-degree out-of-phase relation. This means that these groups of elements have different sensitivities with respect to the X axis external magnetic field Hext. The dimensions and an anisotropic magnetic field applied in the elements are such that the elements 700 and 702 have positive sensitivity to the external field Hext while the other elements 701 and 703 have negative sensitivity up to a magnetic field intensity of 18 Oe. With the bridge connection of the elements as shown in FIG. 24, the resistance detected is given as follows:

$$\Delta R = 2(\Delta R700 - \Delta R701)/(2R + \Delta R700 + \Delta R701) \quad (12)$$

where ΔR700 is the change in the resistance of the elements 700 and 702, and ΔR701 is the change in the resistance of the elements 701 and 703. Zero output can thus be provided when the external magnetic field is zero. In addition, in comparison with a bridge connection arrangement of four elements having the same characteristics, sensitivity improvement can be attained.

Figure 26:
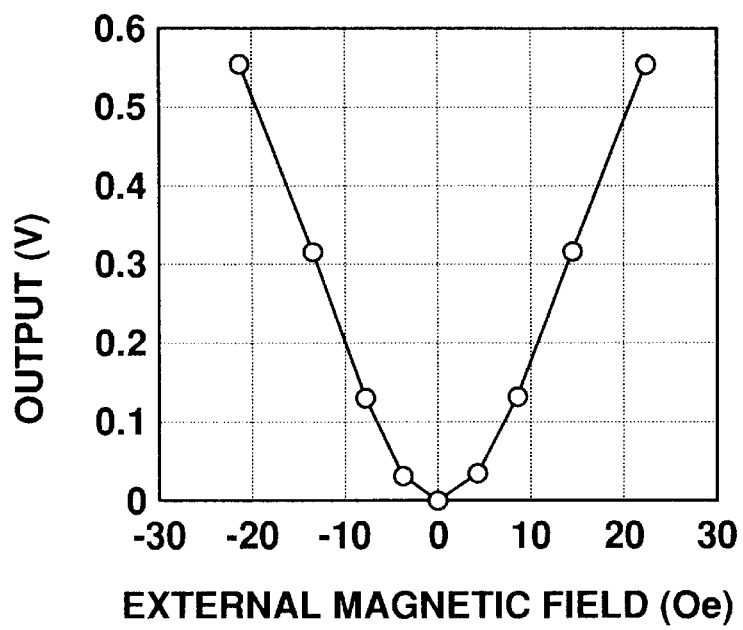
FIG. 26 is a graph showing the relationship between output and external magnetic field.

FIG. 26 shows the element output obtained with the bridge structure of the elements having the output characteristics shown in FIG. 25. With this arrangement, it is possible to realize a highly sensitive magnetic sensor, in which the element output is zero corresponding to zero external magnetic field and is 57% when the field intensity is 22 Oe. By setting the drive current to 2.5 V in effective value, it is possible to construct a magnetic sensor with the very high sensitivity of 27 mV/Oe without any amplifier.

EMBODIMENT 5

Figure 27:
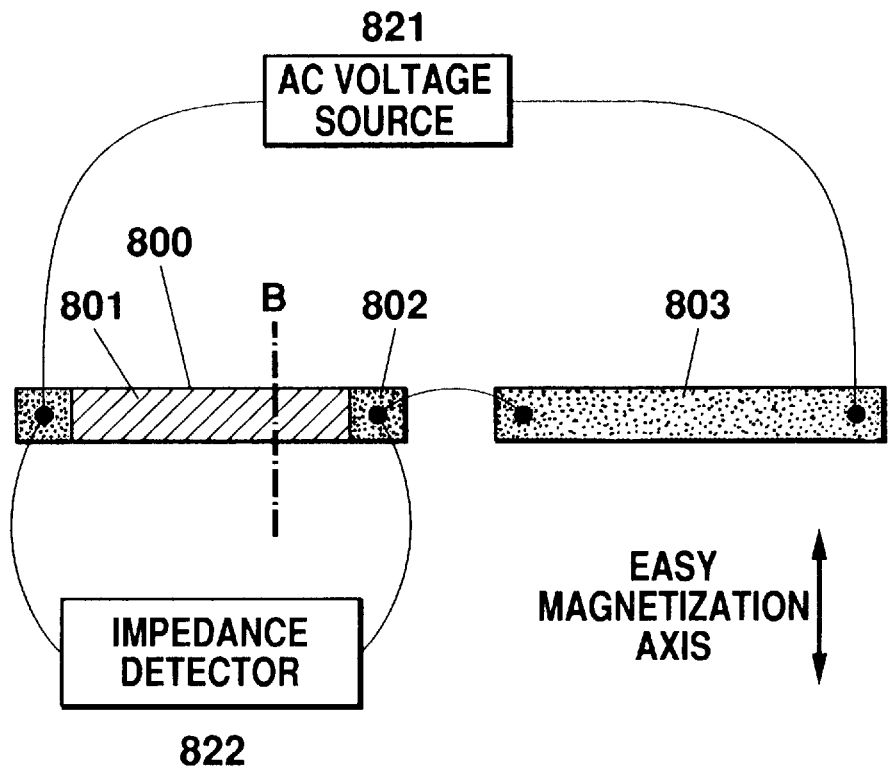
FIG. 27 is a view showing Embodiment 5 of the invention.
Figure 28:
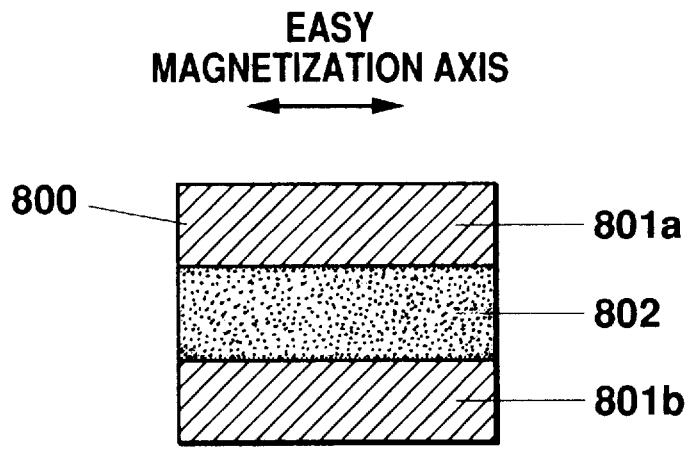
FIG. 28 is a sectional view of the structure of an element in Embodiment 5.

FIGS. 27 and 28 shows Embodiment 5 of the invention. In this embodiment, a sensor element 800 comprising magnetic layers 801a and 801b of CoNbZr alloy and a conductive layer 802 of Cu interposed between the layers 801a and 801b and a resistor 803 of Cu simultaneously formed by the vacuum deposition process. The element 800 and resistor 803 are connected in series across an AC power source 821. An impedance sensor 822 is connected across the element 800. The element 800 and the resistor 803 have a length of 5 mm. The magnetic layer 801 of the element 800 has a length of 4.5 mm. The element 800 and the resistor 803 have a width of 0.5 mm. The magnetic layers 801a and 801b have a thickness of 2 μm The conductive layer 802 has a thickness of 3 μm.

FIG. 28 shows a sectional view of the element 800 taken along line B in FIG. 27. At opposite ends of the conductive layer 802 of Cu, the magnetic layers 801a and 801b are not in contact with each other but are separated from each other by the conductive layer 802. The easy magnetization axis of the magnetic layers is formed during the formation thereof in the presence of an applied DC magnetic field, and it is directed in a direction orthogonal to the direction of AC voltage application.

The voltage supplied from the AC voltage source 821 is 10 mV in effective value and at a drive frequency of 10 KHz to 10 MHz.

EMBODIMENT 6

Figure 29:
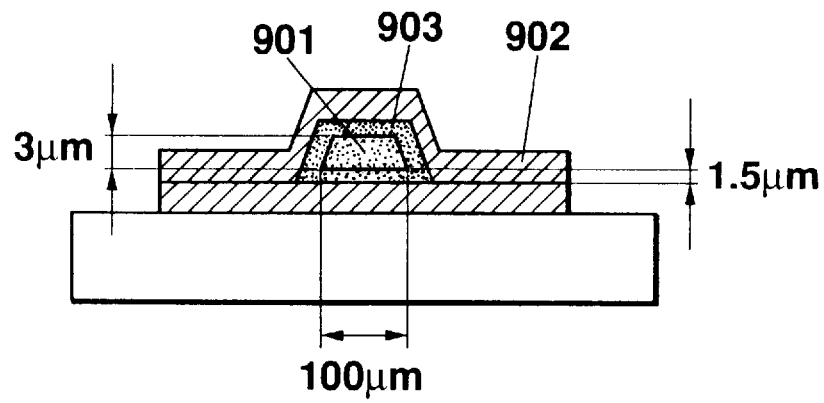
FIG. 29 is a sectional view of the structure of an element in Embodiment 6.

FIG. 29 shows Embodiment 6 of the invention applied to a laminated thin film magnetic sensor. In this structure, a conductive layer 901 is enclosed in a magnetic layer 902. The magnetic layer 902 is imparted with magnetic anisotropy in its width direction. The magnetic layer 902 is of an FeCoSiB or CoNbZr type zero magnetostriction amorphous material. The conductive layer 901 has a width of 100 $\mu$m, a length of 10 mm and a thickness of 3 $\mu$m. The conductive layer 901 is of Cu or Ag, a low resistivity material. The magnetic layer 902, which is formed over and under the conductive layer 901, has a width of 2 mm, a length of 10 mm and a thickness of 2 $\mu$m.

An insulating film 903 is provided between the conductive and magnetic layers 901 and 902. The insulating layer 903 is of such insulating material as $SiO_2$ or polyimide type resins.

The magnetic layer 902 may be bestowed with magnetic anisotropy using either a method in which the layer formation is carried out in the presence of an applied magnetic field, or a method in which heat treatment is carried out in the presence of an applied magnetic field. In this element, in order to provide for the stability of the atomic arrangement irrespective of temperature changes, the magnetic layer 902 is bestowed with magnetic anisotropy by heat treatment in the presence of an applied magnetic field such that its easy magnetization axis is directed in its width direction.

The conductive layer 901 of the element is energized by a high frequency current. Since the conductive and magnetic layers 901 and 902 are insulated from each other by the insulating layer 903, the energizing current flows entirely into the conductive layer 901. It is thus possible to obtain effective generation of magnetic flux linking with the magnetic layer 902. This means that it is possible to provide for significant changes in the inductance component of the element with respect to an external magnetic field.

The width of the conductive layer 901 is set to 100 $\mu$m, thus permitting effective generation of a skin effect in the conductive layer 901 in the width direction thereof by a leakage flux linking vertically with the conductive layer 901 from the magnetic layer 902. It is thus possible to provide for significant changes in the resistance component in the element with respect to an external magnetic field.

EMBODIMENT 7

Figure 30:
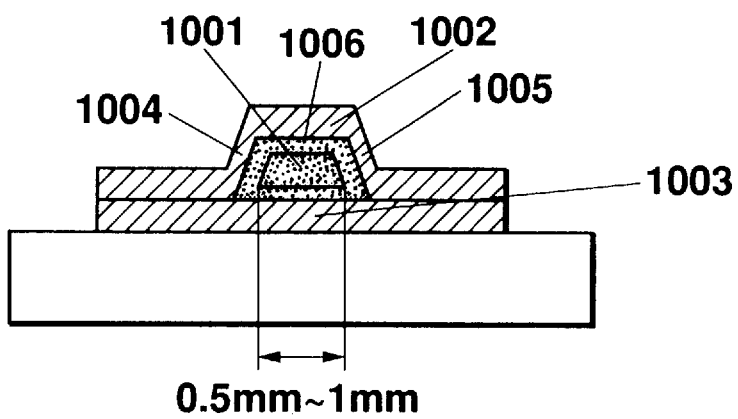
FIG. 30 is a sectional view of the structure of an element in Embodiment 7.

FIG. 30 shows Embodiment 7 of the invention, again applied to a laminated thin film magnetic sensor. In this element, a conductive layer 1001 is enclosed by an upper magnetic layer 1002, a lower magnetic layer 1003 and side magnetic layers 1004 and 1005. The upper and lower magnetic layers 1002 and 1003 are imparted with magnetic anisotropy in their width directions.

The upper and lower magnetic layers 1002 and 1003 are of a CoNbZr type material, which has high saturation magnetization among zero magnetostriction amorphous materials. The conductive layer 1001 has a width of 300 $\mu$m, a length of 10 mm and a thickness of 3 $\mu$m. The conductive layer 1001 is of Cu or Ag, a low resistivity material. The upper and lower magnetic layers 1002 and 1003 have a width of 2 mm, a length of 10 mm and a thickness of 2 $\mu$m. Like Embodiment 6, an insulating layer 1006 (of SiO2 or a polyimide resin, for instance) is provided between the conductive layer 1001 and the magnetic layers 1002 to 1005.

For bestowing the magnetic layers 1002 to 1005 with magnetic anisotropy, two methods may be used, i.e., one in which the layers are formed in the presence of an applied magnetic field, and one in which heat treatment is carried out in the presence of an applied magnetic field. In this element, in order to simplify the manufacturing process, the multi-layered thin film formation and bestowing of the magnetic layers 1002 to 1005 with magnetic anisotropy are carried out at the same time in the presence of an applied magnetic field.

The conductive layer 1001 in this element, like Embodiment 6, is energized by a high frequency current. Since the conductive layer 1001 and the magnetic layers 1002 to 1005 are insulated from one another, the entire energizing current flows into the conductive layer 1001. In this Embodiment 7, unlike Embodiment 6, the side magnetic layers 1004 and 1005 are of a low magnetic permeability material. The magnetic permeability of the side magnetic layers 1004 and 1005 may be controlled to control cycling flux linking with the magnetic layers 1002 to 1005 and leakage flux between the upper and lower magnetic layers 1002 and 1003. The flux linking with the magnetic layers 1002 to 1005 determines the inductance, and the leakage flux between the upper and lower magnetic layers 1002 and 1003 determines the resistance due to the skin effect in the width direction of the conductive layer 1001. This means that the inductance and resistance of the element can be controlled by varying the magnetic permeability of the side magnetic layers 1004 and 1005. As means for varying the magnetic permeability of the side magnetic layers 1004 and 1005, for instance, FeCoSiB, which is a low magnetic saturation zero magnetostriction amorphous material may be used. In lieu of varying the magnetic permeability of the side magnetic layers 1004 and 1005 for controlling the leakage flux between the upper and lower magnetic layers 1002 and 1003 as in this embodiment, the overlap width of the side magnetic layers 1004 and 1005 may be varied to effect leakage flux control.

The width of the conductive layer 1001 is set to an optimum value. An insufficient conductive layer width results in over-current generation, so that no skin effect is generated. An excessive width of the layer 1001, on the other hand, promotes the over-current generation, thus facilitating the skin effect generation. Increasing the width of the layer 1001, however, also increases the element size. With increased element size, the floating impedance (i.e., inductance and capacitance) can no longer be ignored in a case when the element is driven in a high frequency range. For the above reasons, in this embodiment, the width of the conductive layer 1001 is set to 500 $\mu$m to 1 mm.

What is claimed is:

1. A magnetic sensor energized by a high frequency current from a high frequency power source for detecting an electrical characteristic change in a conductive layer and a magnetic layer corresponding to an external magnetic field, comprising:

a substrate;

a magnetic layer formed on the substrate and containing a magnetic material; and a conductive layer energized by the high frequency power source and positioned within the magnetic layer and containing a conductive material, wherein the magnetic layer is anisotropic with an easy magnetization axis directed in its width direction orthogonal to the direction of energization by the high frequency current from the high frequency power source, and wherein a magnetic flux surrounding said conductive layer is generated by said high frequency current in a direction of said easy magnetization axis.

2. The magnetic sensor according to claim 1, wherein:

the conductive layer has a broad sectional profile, its dimension in its width direction orthogonal to the direction of energization by the high frequency current from the high frequency power source being greater than its dimension in its height direction.

3. The magnetic sensor according to claim 2, wherein:

the conductive layer has $\frac{1}{10}^{th}$ or less of the resistivity of the magnetic layer.

4. The magnetic sensor according to claim 3, wherein:

the magnetic layer has a resistivity of 50 $\mu\Omega$ cm or above, a coercive force of 1 Oe or below, and a specific magnetic permeability in DC magnetic field of 500 or above.

5. The magnetic sensor according to claim 4, wherein:

the entire thickness of the magnetic sensor is 10 $\mu$m or below, and the ratio of the thickness of the conductive layer to the thickness of the magnetic layer is 3:1 to 1:5.

6. The magnetic sensor according to claim 5, wherein:

the magnetic layer contains FeCoSiB or CoSiB as the magnetic material, and the conductive layer contains Cu as the conductive material.

7. A magnetic sensor for detecting an external magnetic field, comprising:

four magnetic sensor elements forming an electrical bridge structure;

each magnetic sensor element being energized by a high frequency current from a high frequency power source for detecting an electrical characteristic change in a conductive layer and a magnetic layer corresponding to an external magnetic field, and comprising:

a substrate;

a magnetic layer formed on the substrate and containing a magnetic material; and a conductive layer energized by the high frequency power source and positioned within the magnetic layer and containing a conductive material, wherein the magnetic layer is anisotropic with an easy magnetization axis directed in its width direction orthogonal to the direction of energization by the high frequency current from the high frequency power source, and wherein a magnetic flux surrounding said conductive layer is generated by said high frequency current in a direction of said easy magnetization axis.

8. The magnetic sensor according to claim 7, wherein:

the four magnetic sensor elements form an electrical bridge structure comprising two groups of magnetic sensor elements, the easy magnetization axis directions of the magnetic layers of the two groups being different from each other by 90°.

9. The magnetic sensor according to claim 8, which further comprises:

a mono-stable multi-vibrator as a drive for detecting a magnetic field as a phase difference between resistance and reactance.

10. The magnetic sensor according to claim 1, wherein:

an insulating layer is interposed between the magnetic and conductive layers.

11. The magnetic sensor according to claim 10, wherein:

the conductive layer has a broad sectional profile, its dimension in its width direction orthogonal to the direction of energization by the high frequency current from the high frequency power source being greater than its dimension in its height direction.

12. The magnetic sensor according to claims 11, wherein:

the conductive layer has a width greater than a skin depth capable of effectively carrying a current given as $$\delta = \sqrt{[2\rho/\omega \cdot \mu]}$$

where $\rho$ is the relative resistivity of the conductive layer, $\mu$ is the magnetic permeability of the magnetic layer, and $\omega$ is the angular frequency of the energizing current.

13. The magnetic sensor according to claim 12, wherein:

the conductive layer has a thickness less than the skin depth.

14. The magnetic sensor according to claim 13, wherein:

the conductive layer has a width of 100 $\mu$m or above.

15. The magnetic sensor according to claim 17, wherein:

the conductive layer has $\frac{1}{10}$ or below of the resistivity of the magnetic layer.

16. The magnetic sensor according to claim 15, wherein:

the magnetic layer has a resistivity of 50 $\mu\omega$.cm or above, a coercive force of 1 Oe or below, and a specific magnetic permeability in DC magnetic field of 500 or above.

17. The magnetic sensor according to claims 16, wherein:

the magnetic layer contains FeCoSiB or CoSiB as the magnetic material, and the conductive layer contains Cu as the conductive material.

18. A magnetic sensor for detecting an external magnetic field comprising:

four magnetic sensor elements forming an electrical bridge structure;

each magnetic sensor element being energized by a high frequency current from a high frequency power source for detecting an electrical characteristic change in a conductive layer and a magnetic layer corresponding to an external magnetic field, and comprising:

a substrate;

a magnetic layer formed on the substrate and containing a magnetic material;

a conductive layer energized by the high frequency power source and positioned within the magnetic layer and containing a conductive material, wherein the magnetic layer is anisotropic with an easy magnetization axis directed in its width direction orthogonal to the direction of energization by the high frequency current from the high frequency power source; and an insulating layer interposed between the magnetic and conductive layers, and wherein a magnetic flux surrounding said conductive layer is generated by said high frequency current in a direction of said easy magnetization axis.

19. The magnetic sensor according to claim 18, wherein:

the four magnetic sensor elements form an electrical bridge structure comprising two groups of magnetic sensor elements, the easy magnetization axis directions of the magnetic layers of the two groups being different from each other by 90°.

20. The magnetic sensor according to claim 19, which further comprises:

a mono-stable multi-vibrator as a drive for detecting a magnetic field as a phase difference between resistance and reactance.

21. The magnetic detector according to claim 1, wherein:

the magnetic layer is formed by thin film formation in the presence of a DC magnetic field.

* * * * *

UNITED STATES PATENT AND TRADEMARK OFFICE
CERTIFICATE OF CORRECTION

PATENT NO. : 5,838,154
DATED : November 17, 1998
INVENTOR(S) : Takeshi Morikaw et al.

It is certified that error appears in the above-identified patent and that said Letters Patent is hereby corrected as shown below:

On the title page, item [54], Col. 1, lines 1-3. the title should read:

--MULTILAYERED MAGNETIC SENSOR
HAVING CONDUCTIVE LAYER WITHIN
MAGNETIC LAYER--

Signed and Sealed this

First Day of June, 1999

*Attest:*

Q. TODD DICKINSON

*Attesting Officer*     Acting Commissioner of Patents and Trademarks

UNITED STATES PATENT AND TRADEMARK OFFICE
CERTIFICATE OF CORRECTION

PATENT NO. : 5,838,154
DATED : November 17, 1998
INVENTOR(S) : Takeshi Morikawa, et. al.

It is certified that error appears in the above-identified patent and that said Letters Patent is hereby corrected as shown below:

Claim 16, line 2, delete "50µω.cm" to --50µΩcm--.

Signed and Sealed this

Thirtieth Day of November, 1999

Attest:

Q. TODD DICKINSON

Attesting Officer

Acting Commissioner of Patents and Trademarks